(12) United States Patent
Horbach et al.

(10) Patent No.: US 8,217,718 B2
(45) Date of Patent: Jul. 10, 2012

(54) HIGHLY EFFICIENT CLASS-D AMPLIFIER

(75) Inventors: Ulrich Horbach, Canyon Country, CA (US); Armando Martinez, Castaic, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

(21) Appl. No.: 12/885,141

(22) Filed: Sep. 17, 2010

(65) Prior Publication Data

US 2012/0068739 A1 Mar. 22, 2012

(51) Int. Cl.
 *H03F 3/217* (2006.01)
(52) U.S. Cl. ..................... 330/251; 330/207 A
(58) Field of Classification Search ............ 330/10, 330/207 A, 251
See application file for complete search history.

(56) References Cited

U.S. PATENT DOCUMENTS

| | | | | |
|---|---|---|---|---|
| 6,097,249 A | * | 8/2000 | Strickland et al. | 330/10 |
| 6,639,815 B1 | * | 10/2003 | Gucyski | 363/40 |
| 6,856,193 B2 | | 2/2005 | Lambruschi et al. | |
| 7,733,178 B1 | * | 6/2010 | Delano et al. | 330/251 |
| 2010/0289560 A1 | * | 11/2010 | Mavencamp et al. | 327/538 |

OTHER PUBLICATIONS

Internationial Rectifier; Application Note AN-940 How P-Channel MOSFETs Can Simplify Your Circuit; www.irf.com.
Honda, Jun et al.; Class D Audio Amplifier Design; International Rectifier; Oct. 8, 2003; www.irf.com.
Horbach, Ulrich; Perceptually Optimized Power Amplifiers for Music Reproduction; Harman International; Jul. 22, 2009.

* cited by examiner

*Primary Examiner* — Henry Choe
(74) *Attorney, Agent, or Firm* — The Eclipse Group LLP

(57) ABSTRACT

A simplistic low cost circuit that generates the necessary drive voltage for use in a source follower totem pole power switching circuit is described where the simplified gate drive circuit may have a dual charge pump and a complementary pair of low-power switching Mosfets.

16 Claims, 7 Drawing Sheets

HIGHLY EFFICIENT CLASS-D AMPLIFIER

BACKGROUND

1. Field of the Invention

The present invention relates to amplifiers and more particularly to switched-mode (class-D) power amplifiers.

2. Related Art

Typically, switched-mode (class-D) power amplifiers offer very high efficiencies at large levels of sinusoidal or other artificial test signals. However, when applied to music signals, the levels of which are low in the average, idle power loss becomes a significant factor. A typical 100 W class-D amplifier may dissipate 3 W or more of power at low levels. In applications where a large number of amplifiers (5-10) are required in small spaces, such as audio/video receivers or soundbars, total power dissipation becomes a major issue. Idle power loss may be minimized, but traditionally at the expense of introducing distortion around zero crossing of the signal (crossover distortion). This form of distortion leads to information loss, is particularly audible, and is not correctly represented by traditional distortion measures such as THD (total harmonic distortion).

Crossover distortion in conventional class-D amplifiers, which use a pair of n-channel Mosfet transistors as power switches, is caused by "dead-time." A certain amount of time, typically (20-100) nsec, must be inserted during switching transitions in order to prevent both switches being turned on at the same time, which if turned on at the same time, would cause very high current peaks ("shoot-through").

Switching without dead-time may be possible with a pair of complementary Mosfets in source follower configuration ("totem pole"). In this configuration, the gates and sources of both devices are tied together, respectively. The gate voltage of either device has to decrease below its own threshold before it can exceed the threshold of the other device. It is inherently impossible to turn both devices on simultaneously with this configuration.

The main problem with implementing the source follower totem pole is the gate drive circuit. This is because the drive voltage must exceed the power supply rail voltage by at least the source-gate threshold voltage to turn either device on. In the past, the circuits to generate this threshold voltage have been complicated and expensive relative to the cost of the rest of the circuit.

Turning to FIG. 1, a prior art circuit 100 is shown where a pulse transformer is used to drive a source-follower totem pole. A problem with this circuit is the cost and size of the transformer, and its limited bandwidth, in particular low-frequency extension. In FIG. 2, another prior art circuit is shown that discloses a source follower gate drive circuit 200 and may be seen in U.S. Pat. No. 6,856,193. This approach requires a so-called "differential comparator," whose supply voltage must be referenced to the amplifier output, rather than ground, and a floating supply voltage V1, see FIG. 2. Further details are not given in this patent application and floating power supplies are expensive, difficult to implement, and may cause major electromagnetic interference problems that require even more expense to isolate or eliminate.

Accordingly, a need exists for a simple, low cost circuit that generates the necessary drive voltage for use in a source follower totem pole gate drive circuit. In particular, it is desirable to have a low cost gate drive circuit that overcomes the limitations and problems described above.

SUMMARY

In view of the above, an approach for a simplistic low cost circuit that generates the necessary gate drive voltage for use in a source follower totem pole power switching circuit is described. A simplified gate drive circuit may comprise a dual charge pump and a complementary pair of low-power switching Mosfets. The average supply current for the source follower gate drive circuit in accordance with one example of an implementation of the invention, a high-performance 60 W amplifier, may be 10 mA and corresponds to a gate drive power of 7V×10 mA=70 mW. Therefore, the total idle power for the amplifier is the sum of both the idle power loss (200 mW) and gate drive power (70 mW), which equals 270 mW total idle power showing significant reduction in the idle power compared to traditional circuits, without compromising low-level signal distortion introduced by excessive dead time in such traditional circuits.

It is to be understood that the features mentioned above and those yet to be explained below may be used not only in the respective combinations indicated, but also in other combinations or in isolation without departing from the scope of the invention.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The description below may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
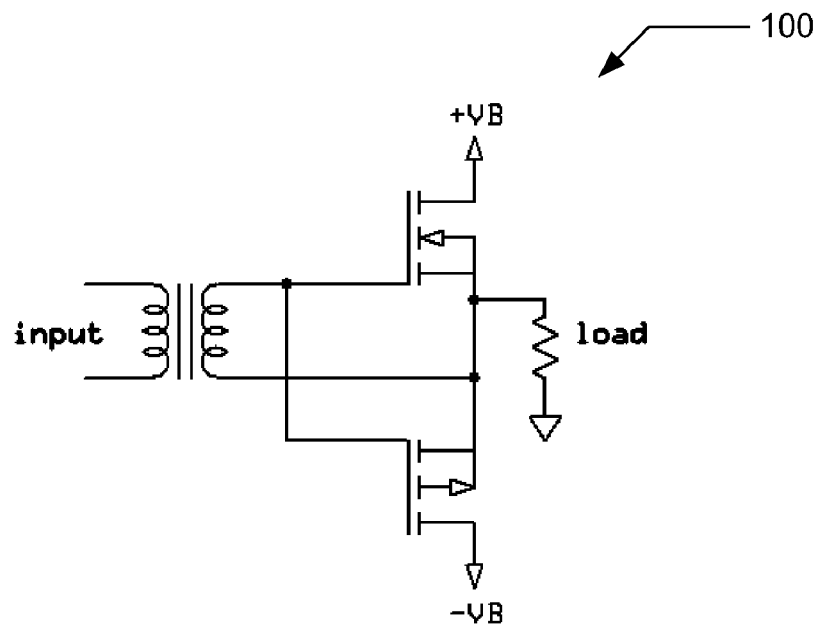
FIG. 1 is a circuit diagram of a pulse transformer used to drive a source-follower totem pole.

The following description of various examples of implementations is given only for the purpose of illustration and is not to be taken in a limiting sense. The partitioning of examples in function blocks, modules or units shown in the drawings is not to be construed as indicating that these function blocks, modules or units are necessarily implemented as physically separate units. Functional blocks, modules or units shown or described may be implemented as separate units, circuits, chips, functions, modules, or circuit elements. One or more functional blocks or units may also be implemented in a common circuit, chip, circuit element or unit.

Figure 2:
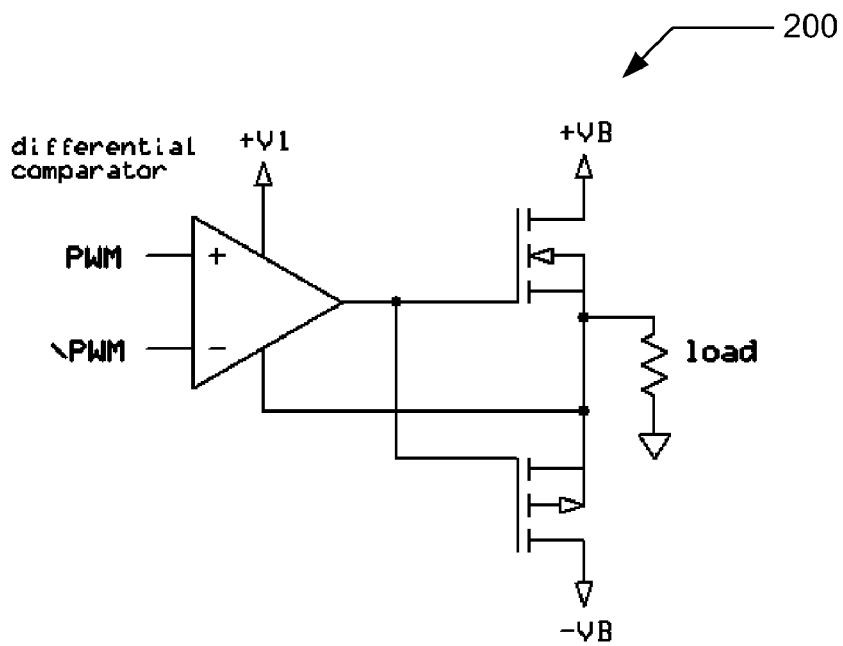
FIG. 2 is a circuit diagram of a source follower gate drive circuit with a differential comparator.
Figure 3:
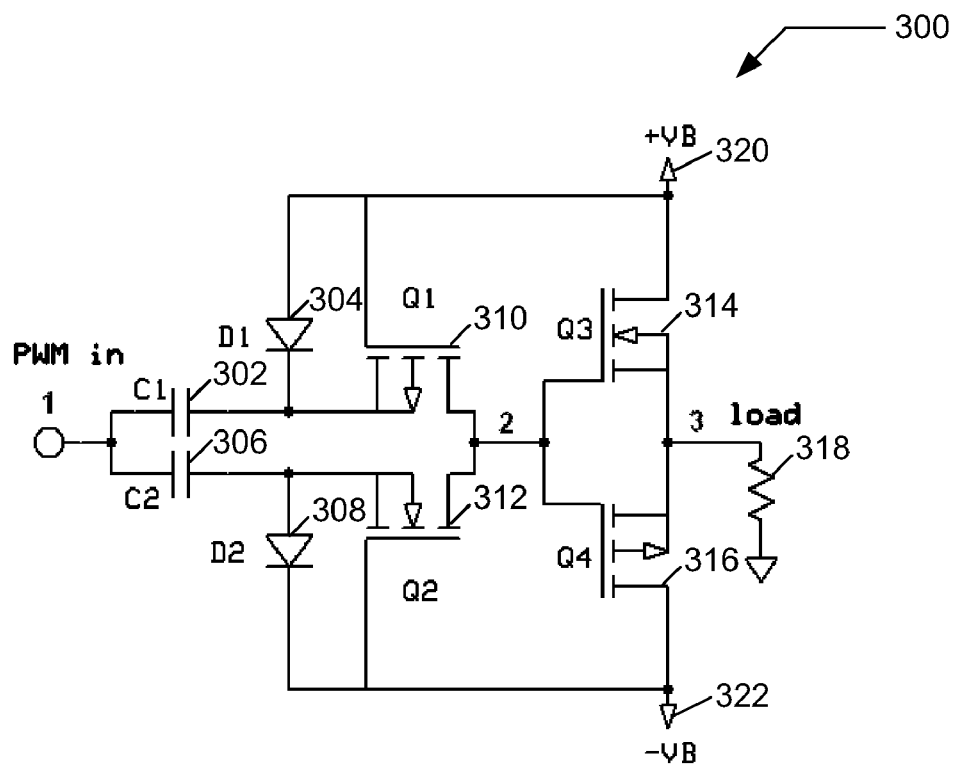
FIG. 3 is a circuit diagram of a source follower gate drive circuit and an output power source follower switching stage in accordance with one example of an implementation of the invention.

In FIG. 3, a circuit diagram 300 of a source follower gate drive circuit and an output power switching stage in accordance with an example implementation of the invention is shown. The simplified gate drive circuit shown in FIG. 3 depicts a dual charge pump made up of C1 302, D1 304, and C2 306, D2 308, a complementary pair of low-power switching Mosfets Q1 310 and Q2 312. The output totem pole in source follower configuration comprises Q3 314 and Q4 316 connected to a resistive load 318. The components or component values in the example implementation may be: C1 302 is 0.47 μF; C2 306 is 0.47 μF (note C1=C2); D1 304 may be a 1N4148 diode manufactured by NXP SEMICONDUCTORS™; D2 308 may also be a 1N4148 diode manufactured by NXP SEMICONDUCTORS™; Q1 310 may be a ZXMP10A13 transistor manufactured by ZETEX SEMICONDUCTOR™; Q2 312 may be a ZXMN10A07 transistor manufactured by ZETEX SEMICONDUCTOR™; Q3 314 may be a FDD5612 transistor manufactured by FAIRCHILD SEMICONDUCTOR™; and Q4 316 may be a FDD5614 transistor by FAIRCHILD SEMICONDUCTOR™. Further, the supply voltage of the circuit in FIG. 3 is referenced to the ground and not a floating supply voltage as disclosed in FIG. 2.

In the current example, VB 320, 322 may be set equal to +/−24V and an input square wave signal of amplitude 0V/6V. When the input voltage is 0V, C1 302 is charged to 23.4V (24V—voltage across D1 304). The source voltage of Q1 310 is 23.4V (Q1 is turned off) and the source voltage of Q2 312 is −29.4V (Q2 is turned on). Q4 316 is also turned on with the output voltage being −24 volts.

When VB 320, 322 is at the 6V portion of the input square wave, C2 206 is charged to —29.4V (−24V−6V+voltage across D2 308). The source voltage of Q1 310 is 29.4V (Q1 310 is turned on) and source voltage of Q2 312 is −23.4V (Q2 312 is turned off), Q3 is turned on and the output voltage is 24V. It is understood that there may be slight variation in these voltages due to types and tolerances of components used.

Figure 4:
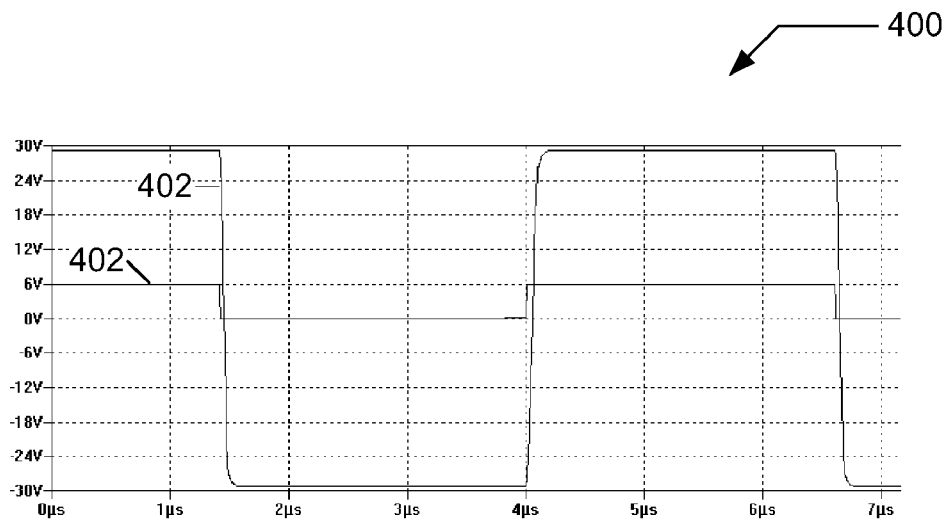
FIG. 4 is a drawing of a graph of the input signal and gate drive signal of the source follower gate drive circuit of FIG. 3 in accordance with one example of an implementation.

Turning to FIG. 4, a drawing of a graph 400 of the input signal and gate drive signal of the source follower gate drive circuit of FIG. 3 is shown. The input signal 402 (shown at point "1" in the circuit) and gate drive signal 404 (shown at point "2" in the circuit) are shown in the graph 400. The input signal 402 is a square wave that alternates between 0V and 6V. The gate drive signal 404 is approximately a square wave that alternates between 29.4V and −29.4V with transitions lagging the input signal's 402 transitions.

Figure 5:
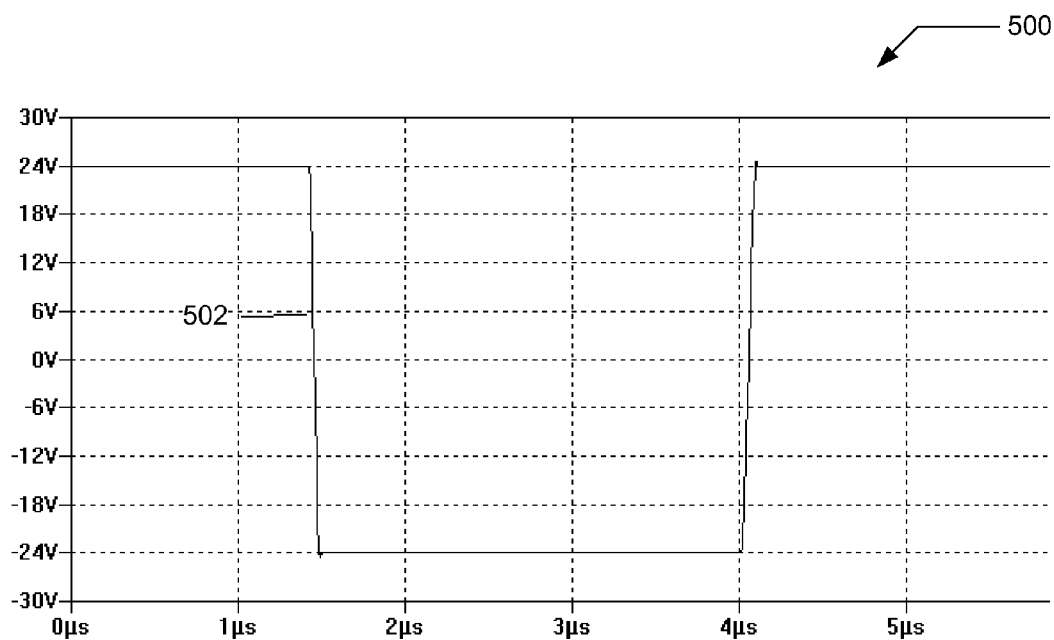
FIG. 5 is a drawing of a graph of the output signal of the source follower gate drive circuit of FIG. 3 in accordance with one example of an implementation.

In FIG. 5, a drawing of a graph 500 of the output signal 502 of the source follower totem pole circuit in FIG. 3 is shown. The output signal 502 (shown at point 3 in the circuit) is shown across a load 318 and also has a square waveform that alternates between 24V and −24V.

Figure 6:
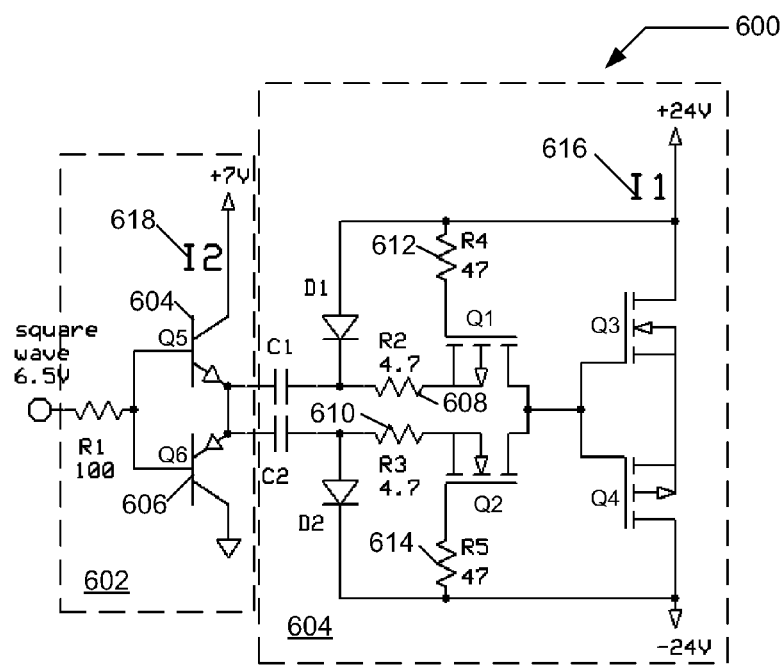
FIG. 6 is a source follower gate drive circuit of FIG. 3 with an input buffer in accordance with one example of an implementation of the invention.

Turning to FIG. 6, a circuit diagram 600 of the source follower circuit 300 of FIG. 3 with an input buffer 602 in accordance with one example of an implementation of the invention is depicted. The input buffer driver Q5 604 and Q6 606 may be needed in actual applications. The resistors R2 608 and R3 610 are chosen to limit the gate drive power at the expense of slower transitions of the output wave form. The resistors R2 608 and R3 610 are both 4.7 Ohm resistors and resistors R4 612 and R5 614 are both 47 Ohm resistors in the example. The purpose of R4 and R5 is to suppress parasitic oscillations. Their value is not critical and may be in the range from 20 Ohm to 100 Ohm.

Figure 7:
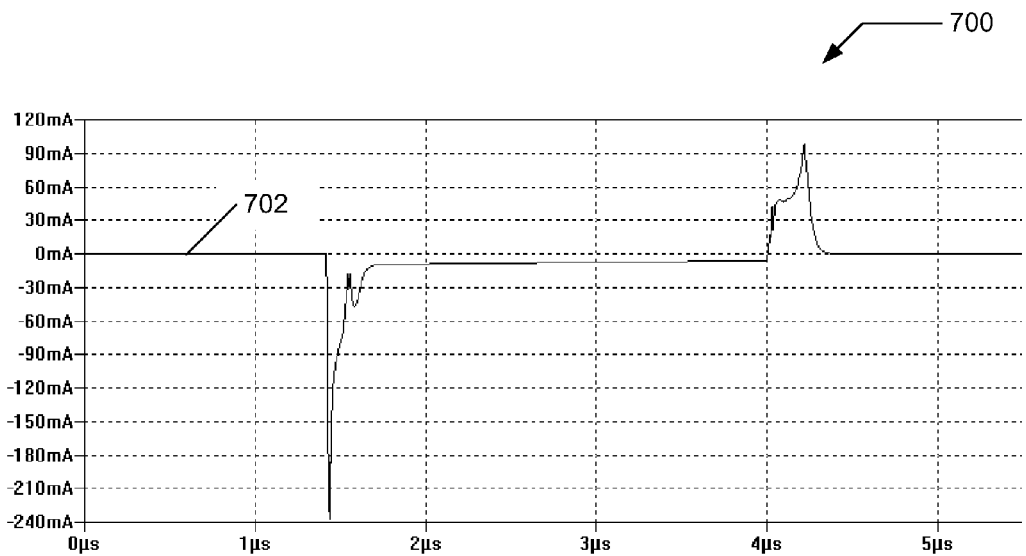
FIG. 7 is a graph of the current at "I1" in the source follower gate drive circuit of FIG. 5 in accordance with one example of an implementation of the invention.

In FIG. 7, a graph 700 of the supply current "I1" 616 in the source follower power switching circuit 300 of FIG. 5 is shown. The output current waveform 702 alternates between −240 mA and approximately 105 mA. As can be seen in the graph 700, no shoot-through is present and the remaining peak currents are typically caused by finite recovery times of the output Mosfet's body diodes. The average current is 4.08 mA in the current example, which corresponds to an idle power loss of 2×24V×4.08 mA=200 mW. This is significantly lower than comparable conventional class-D amplifiers of similar power (in this case 60 W into a 4 Ohm load).

Figure 8:
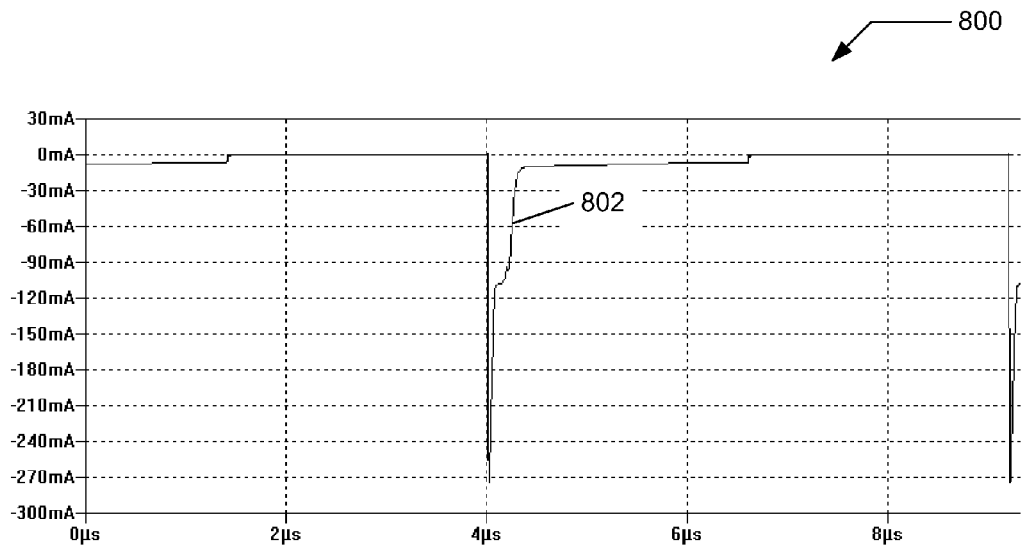
FIG. 8 is a graph of the current at "I2" in the source follower gate drive circuit of FIG. 5 in accordance with one example of an implementation of the invention.

Turning to FIG. 8, a graph 800 of the waveform of the gate drive current "I2" 618 in the source follower power switching circuit 300 of FIG. 5 is shown. The average current is 10 mA for the wave form 802, which corresponds to a gate drive power of 7V×10 mA=70 mW. Therefore, the total idle power for the amplifier is the sum of both the idle power loss (200 mW) and gate drive power (70 mW), which equals 270 mW total idle power. Thus, the total idle power is typically equal to or less than 0.5% of the total power (in the current example idle power of 270 mW is less than 60 W*0.005=300 mW) with a four Ohm load.

Figure 9:
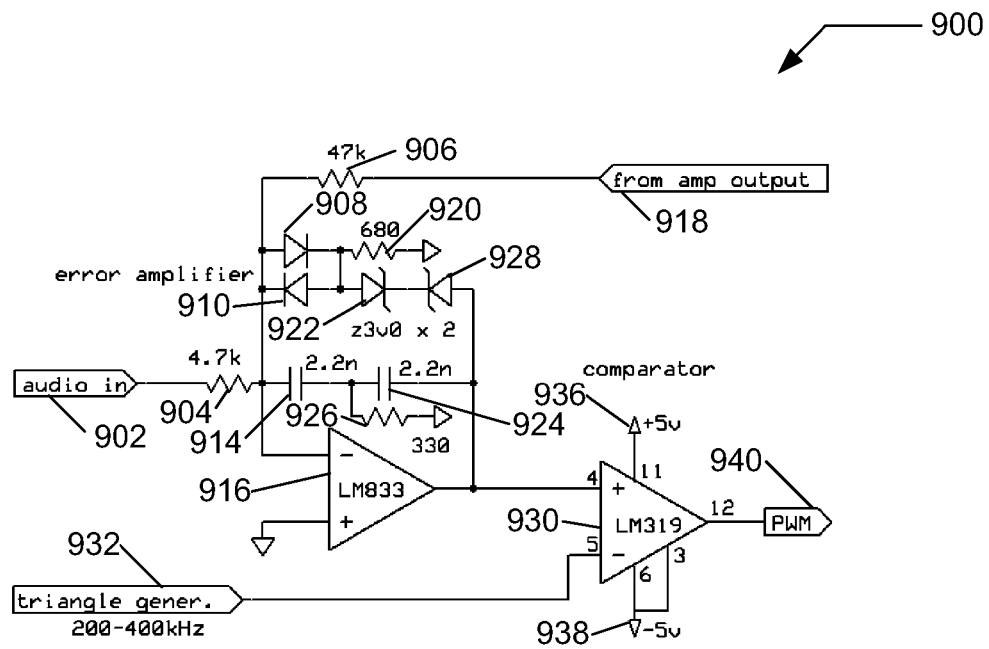
FIG. 9 is a circuit diagram of an example of an error amplifier and comparator be used with a power stage in accordance with one example of an implementation of the invention.

In FIG. 9, a circuit diagram 900 of an error amplifier and comparator to be utilized with a power stage is shown. An audio input 902 passes to a 4.7 k Ohm resistor 904. The 4.7K Ohm resistor 904 is coupled to a 47K Ohm resistor 906, anode of diode 908, cathode of diode 910, 2.2n capacitor 914, and the negative input of an operational amplifier 916, which may, for example, be a type LM833 manufactured by NATIONAL SEMICONDUCTOR™. The 47K Ohm resistor 906 is also coupled to an amplifier output 918. The cathode of diode 908 is coupled to 680 Ohm resistor 920 and the anode of a 3.0V zener diode 922. Similarly, the anode of diode 910 is also connected to the resistor 920 and the anode of zener diode 922. The capacitor 914 is also coupled to another 2.2N capacitor 924 and a 330 Ohm resistor 926. The operational amplifier 916 has its + contact connected to ground and its output coupled to capacitor 924, the anode of a 3.0V zener diode 928 and the + input of a comparator 930 LM319 (which may be a NATIONAL SEMICONDUCTOR. Manufactured comparator). The cathode of the zener diode 928 is coupled to the anode of zener diode 922. The amplifier 930 has a 200-400 kHz triangle signal injected into the − input from a triangle signal generator 932, a connection to +5v 936, connections to −5V 938 and a pulse-width modulated (PWM) output 940.

The circuit 900 of FIG. 9 implements an error amplifier with second order integrator, voltage clamp and feedback path, a comparator, and an input that is connected to a triangle generator 932. The output of the comparator (amplifier 930) is the pulse-width modulated (PWM) signal that may be connected to an output stage as shown in FIG. 10.

Figure 10:
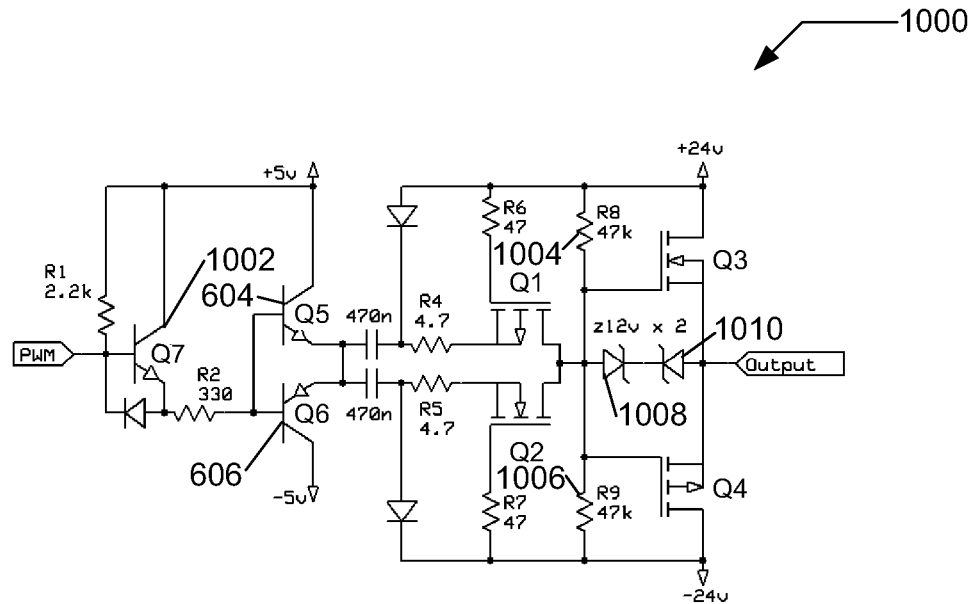
FIG. 10 is a circuit diagram of a power switching stage in accordance with one example of an implementation of the invention.

Turning to FIG. 10, a circuit diagram 1000 of a half-bridge output stage in accordance with an example implementation of the invention is shown. In addition to the components shown in FIG. 6, a buffer Q7 1002 interfaces the open-collector output of the comparator (amplifier 930, FIG. 9) to the driver input of Q5 604 and Q6 606. The circuit also includes two 47K Ohm resistors 1004, 1006 and two 12v Zener diodes 1008, 1010 that protect the output transistors by limiting their gate voltage.

Figure 11:
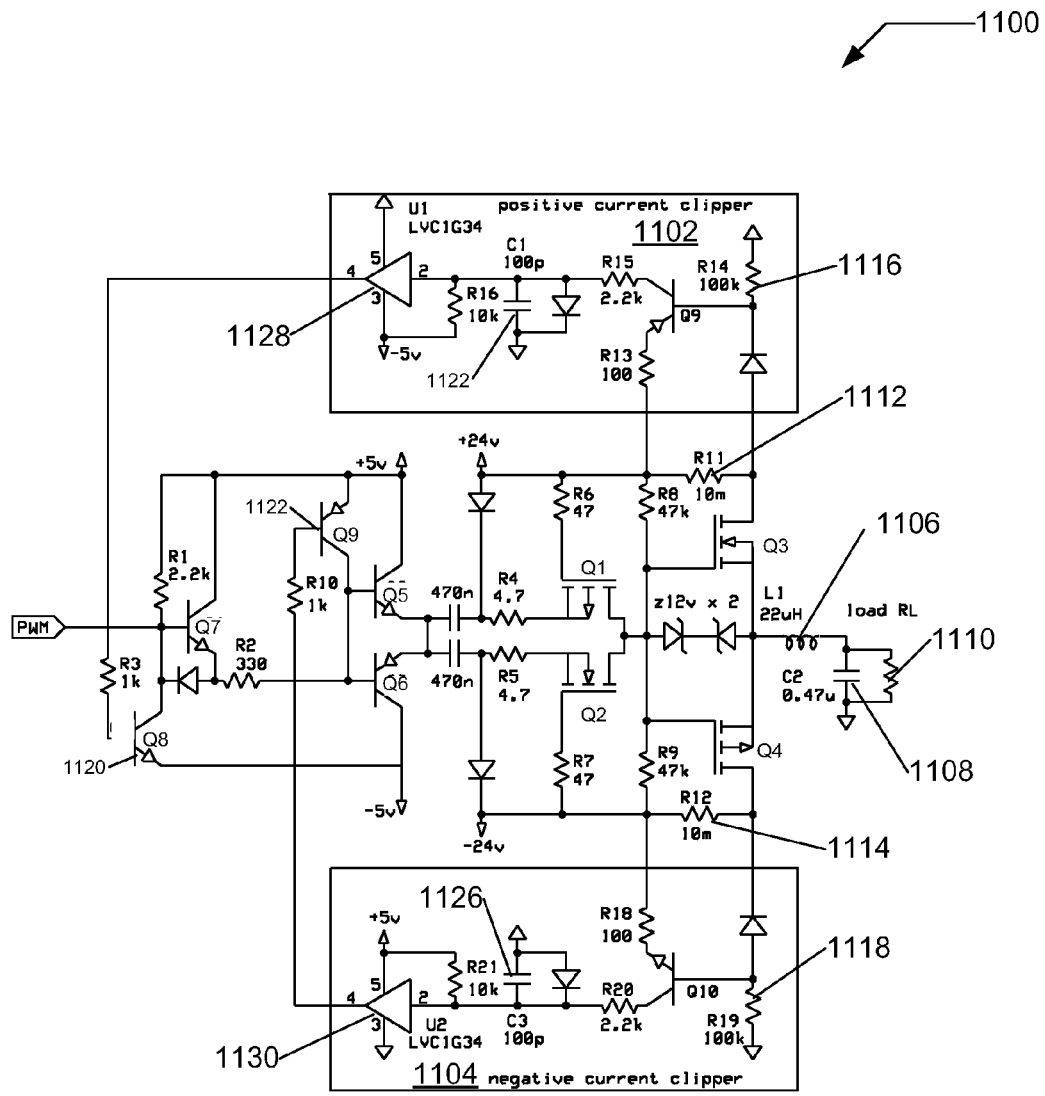
FIG. 11 is a circuit diagram of the power stage with current limiting circuitry in accordance with one example of an implementation of the invention.

In FIG. 11, a circuit diagram 1100 that includes the power stage 1000 of FIG. 10 with current limiting circuitry is shown. A current limiter may be implemented with a positive current clipper circuit 1102 and negative current clipper circuit 1104 added to the circuit of FIG. 10. The output of the power stage is depicted with an output filter with a 24 μH inductor L1 1106, 0.47 μF capacitor 1108 and load RL 1110.

If over-current is detected in one of the rails, through a current sensing resistor R11 1112 or R12 1114 (both 10 m Ohm resistors in the current implementation), exceeding a threshold as defined by resistor R14 1116 or R19 1118 respectively, the state of the switch is immediately reversed by connecting the opposite side to ground through transistors Q8 1120 or Q9 1122. The circuit 1100 then enters a state of self-oscillation, the time constant (period) of which is defined by the 100 pF capacitors C1 1124 and C3 1126 (depending on the polarity of the over-current) along with the hysteresis of gate U1 1128 and U2 1130.

Figure 12:
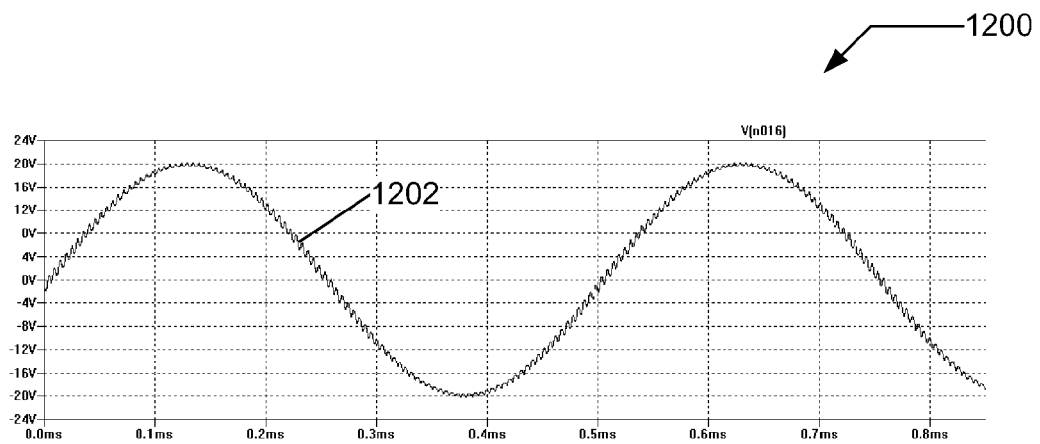
FIG. 12 is a graph of the output signal of the circuit of FIG. 11 into a 4 Ohm load in accordance with one example of an implementation of the invention.
Figure 13:
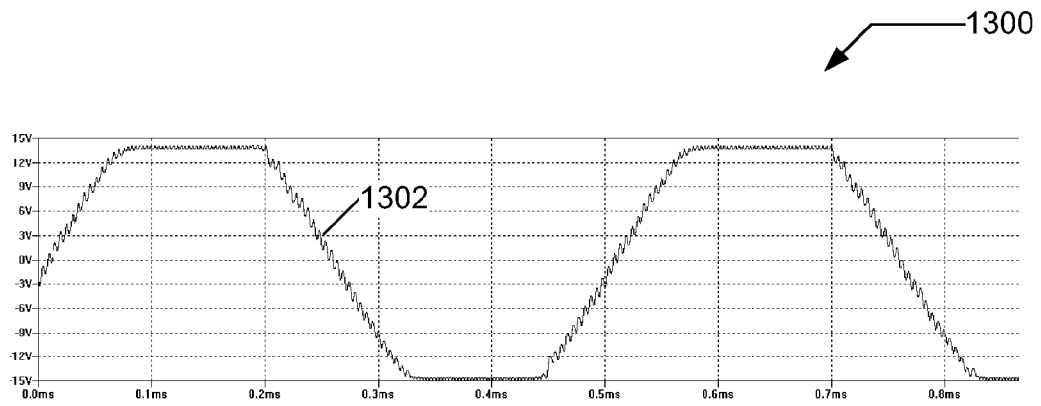
FIG. 13 is a graph of the output signal of the circuit of FIG. 11 into a 2 Ohm load in accordance with one example of an implementation of the invention.

Turning to FIG. 12, a graph 1200 of the output signal 1202 of the circuit 1100 of FIG. 11 into a four Ohm load in accordance with an example implementation of the invention is depicted. A full-range signal of peak amplitude 20V during normal operation is shown. In FIG. 13, a graph 1300 of the output signal 1302 of the circuit 1100 of FIG. 11 into a two Ohm load in accordance with an example implementation of the invention. The current limiting is shown where the peaks and valleys of the sinusoidal output signal are flattened.

The foregoing description of implementations has been presented for purposes of illustration and description. It is not exhaustive and does not limit the claimed inventions to the precise form disclosed. Modifications and variations are possible in light of the above description or may be acquired from practicing examples of the invention. The claims and their equivalents define the scope of the invention.

What is claimed is:

1. An source follower gate drive circuit with an output power source follower switching stage, comprising:
    a dual charge pump:
    a first transistor and a second transistor, where the first transistor and the second transistor, are complementary pair; and
    a third transistor and a fourth transistor, where the third transistor and fourth transistor are in a totem pole source follower configuration and the dual charge pump controls the voltage to the dual charge pump that alternatively activates either the first transistor or the second transistor in response to an input signal where the dual charge pump further includes, a first capacitor to a source voltage of the first transistor that is greater than an input voltage of the input signal and results in the first transistor being turned off and a output of the fourth transistor having a opposite voltage polarity from the source voltage.

2. The source follower gate drive circuit with an output power source follower switching stage of claim 1, where the first transistor and the second transistor are low power Mosfets.

3. The source follower gate drive circuit with an output power source follower switching stage of claim 1, where the dual charge pump further includes, a second capacitor charged to the opposite voltage of the source voltage of the first transistor and less than the input voltage of the input signal and results in the first transistor being turned on and the output of the third transistor having the same polarity as the source voltage.

4. The source follower gate drive circuit with an output power source follower switching stage of claim 3, where the first capacitor and the second capacitor are the same capacitance.

5. The source follower gate drive circuit with an output power source follower switching stage of claim 3, where the first capacitor is coupled to a first diode output of a first diode.

6. The source follower gate drive circuit with an output power source follower switching stage of claim 5, where a second capacitor is coupled to a diode input of a second diode.

7. The source follower gate drive circuit with an output power source follower switching stage of claim 6, where the first diode and the second diode are of equal type.

8. The source follower gate drive circuit with an output power source follower switching stage of claim 1, where the total idle power of the power switching circuit is less than or equal to 0.5% of the total power with a four Ohm load.

9. The source follower gate drive circuit with an output power source follower switching stage of claim 1 where the input signal is a square wave.

10. The source follower gate drive circuit with an output power source follower switching stage of claim 1, further includes an input buffer.

11. The source follower gate drive circuit with an output power source follower switching stage of claim 10, where the input buffer is formed with a fifth transistor coupled to a first resistor and a sixth transistor coupled to a second resistor and the first resistor also coupled to the first transistor and the second resistor also coupled to the second transistor, where the first resistor and the second resistor limit gate drive power.

12. The source follower gate drive circuit with an output power source follower switching stage of claim 11, where the first resistor and the second resistor are equal.

13. The source follower gate drive circuit with an output power source follower switching stage of claim 10, further includes a current limiter.

14. The source follower gate drive circuit with an output power source follower switching stage of claim 13, where the current limiter, further includes a positive current clipper circuit.

15. The source follower gate drive circuit with an output power source follower. switching stage of claim 13, where the current limiter of claim 14, further includes a negative current clipper circuit.

16. The source follower gate drive circuit with an output power source follower switching stage of claim 13, where the current limiter further includes a positive current clipper circuit and a negative current clipper circuit.

* * * * *